(12) United States Patent
Wang et al.

(10) Patent No.: US 10,379,413 B2
(45) Date of Patent: Aug. 13, 2019

(54) ARRAY SUBSTRATE, MANUFACTURING METHOD THEREOF, AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Shoukun Wang, Beijing (CN); Liangliang Li, Beijing (CN); Yuchun Feng, Beijing (CN); Huibin Guo, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/521,339

(22) PCT Filed: Nov. 2, 2016

(86) PCT No.: PCT/CN2016/104309
§ 371 (c)(1),
(2) Date: Apr. 24, 2017

(87) PCT Pub. No.: WO2017/148174
PCT Pub. Date: Sep. 8, 2017

(65) Prior Publication Data
US 2018/0364530 A1    Dec. 20, 2018

(30) Foreign Application Priority Data
Mar. 4, 2016   (CN) .......................... 2016 1 0125905

(51) Int. Cl.
| G02F 1/1362 | (2006.01) |
| G02F 1/1368 | (2006.01) |
| H01L 27/12  | (2006.01) |

(52) U.S. Cl.
CPC ...... *G02F 1/136209* (2013.01); *G02F 1/1368* (2013.01); *G02F 1/136204* (2013.01);
(Continued)

(58) Field of Classification Search
CPC ......... G02F 1/136204; G02F 1/136209; G02F 1/136286; G02F 1/1368; H01L 27/1262; H01L 27/1288
See application file for complete search history.

(56) References Cited

U.S. PATENT DOCUMENTS

| 6,078,372 A | 6/2000 | Kim |
| 9,703,427 B2 | 7/2017 | Zhao et al. |

(Continued)

FOREIGN PATENT DOCUMENTS

| KR | 20140107091 A | 9/2014 | |
| WO | WO-2014092116 A1 * | 6/2014 | ....... G02F 1/133512 |

OTHER PUBLICATIONS

1st Office Action dated Apr. 16, 2018 in CN201610125905.0.
(Continued)

*Primary Examiner* — Allan R Wilson
(74) *Attorney, Agent, or Firm* — Syncoda LLC; Feng Ma

(57) ABSTRACT

This present disclosure provides an array substrate, a manufacturing method thereof, and a display apparatus, aiming at solving the issue of light reflection on the array substrates and improving the display effects of display apparatuses. The array substrate includes a transparent substrate; a plurality of components disposed on a first side of the transparent substrate; and a shielding pattern, disposed on a second side of the transparent substrate, and configured to (Continued)

shield light reflected from a surface of at least one of the plurality of components.

20 Claims, 4 Drawing Sheets

(52) U.S. Cl.
CPC .... *G02F 1/136286* (2013.01); *H01L 27/1262* (2013.01); *H01L 27/1288* (2013.01); *G02F 2001/136231* (2013.01)

(56) References Cited

U.S. PATENT DOCUMENTS

| | | | | |
|---|---|---|---|---|
| 2004/0126941 | A1* | 7/2004 | Yukawa | H01L 27/1214 438/160 |
| 2007/0238217 | A1* | 10/2007 | Shih | G02F 1/136209 438/69 |
| 2008/0203396 | A1* | 8/2008 | Hiroshima | G02F 1/136209 257/72 |
| 2015/0187800 | A1 | 7/2015 | Park et al. | |
| 2015/0316814 | A1* | 11/2015 | Nishiki | G02F 1/133512 349/42 |
| 2015/0362794 | A1* | 12/2015 | Pang | G02F 1/133514 359/891 |
| 2016/0364082 | A1* | 12/2016 | Kimura | G06F 3/044 |
| 2017/0123565 | A1 | 5/2017 | Li | |

OTHER PUBLICATIONS

2nd Office Action dated Aug. 2, 2018 in CN201610125905.0.
International Search Report and Written Opinion dated Feb. 8, 2017 in PCT/CN2016/104309.

* cited by examiner

ARRAY SUBSTRATE, MANUFACTURING METHOD THEREOF, AND DISPLAY APPARATUS

CROSS-REFERENCE TO RELATED APPLICATION

The present application claims priority to Chinese Patent Application No. 201610125905.0 filed on Mar. 4, 2016, the disclosure of which is hereby incorporated by reference in its entirety.

TECHNICAL FIELD

The present disclosure relates generally to display technologies, and more specifically to an array substrate, a manufacturing method thereof, and a display apparatus.

BACKGROUND

Currently thin-film transistor liquid crystal display (TFT-LCD) apparatuses have dominated the market of flat-panel display devices because of their advantages such as small volume, low power consumption, low manufacturing cost, and no radiation etc.

In a common liquid crystal display device, the color film substrate is typically disposed on a side of the array substrate that is opposing to the backlight module. In order to realize a narrow-bezel or bezel-free design for display devices, the array substrate can also be disposed on a side of the color film substrate that is opposing to the backlight module, which can greatly narrow the border area occupied by the binding region of the printed circuit board.

However, if the array substrate is disposed on the light-emitting side, light can reflect on the metal lines, such as the gate lines and data lines, on the array substrate. Especially if the light from the environment is strong, the light reflected by the metal lines can drastically affect the display effects of the display apparatus.

SUMMARY

This present disclosure provides an array substrate, a manufacturing method thereof, and a display apparatus, aiming at solving the issue of light reflection on the array substrates and improving the display effects of display apparatuses.

In one aspect, an array substrate is provided. The array substrate includes a transparent substrate; a plurality of components disposed on a first side of the transparent substrate; and a shielding pattern, disposed on a second side of the transparent substrate, and configured to shield light reflected from a surface of at least one of the plurality of components.

In the array substrate, it is configured such that projection of the shielding pattern on the transparent substrate overlaps with projection of the plurality of components on the transparent substrate. In some embodiments, it is configured such that the projection of the shielding pattern on the transparent substrate has a same pattern as the projection of the plurality of components on the transparent substrate.

The plurality of components as mentioned above may comprise a plurality of thin-film transistors, a plurality of gate lines, and a plurality of data lines.

In some embodiments of the array substrate, the shielding pattern can comprise a black matrix material.

In some other embodiments, the shielding pattern can comprise molybdenum oxide or molybdenum-niobium oxide, and in these embodiments, the array substrate can further comprise an electrostatic shielding layer, which is disposed between the transparent substrate and the shielding pattern.

The array substrate can further comprise a protection layer, which is disposed on a side of the shielding pattern opposing to the transparent substrate.

In a second aspect, this present disclosure provides a display apparatus, which comprises an array substrate according to any of the embodiments as described above.

The display apparatus can further comprise a backlight module and a color film substrate. The backlight module is disposed on one side of the color film substrate opposing to the array substrate.

In a third aspect, this present disclosure provides a method for manufacturing an array substrate as described above. The method can comprises the following steps:

Forming a plurality of thin-film transistors, a plurality of gate lines, and a plurality of data lines on a first side of a transparent substrate; and Forming a shielding pattern on a second side of the transparent substrate, wherein the shielding pattern is configured to shield light reflected from a surface of at least one of the plurality of thin-film transistors, the plurality of gate lines, and the plurality of data lines.

In the method, projection of the shielding pattern on the transparent substrate can overlap with projection of the plurality of thin-film transistors, the plurality of gate lines and the plurality of data lines on the transparent substrate. In some embodiments, the projection of the shielding pattern on the transparent substrate can have a same pattern as the projection of the plurality of thin-film transistors, the plurality of gate lines, and the plurality of data lines on the transparent substrate.

In some embodiments of the method, the shielding pattern can comprise molybdenum oxide or molybdenum-niobium oxide. In these embodiments, the method can further comprise, between the step of forming a plurality of thin-film transistors, a plurality of gate lines, and a plurality of data lines on a first side of a transparent substrate and the step of forming a shielding pattern on a second side of the transparent substrate, a step of forming an electrostatic shielding layer on a second side of the transparent substrate, wherein the electrostatic shielding layer is disposed between the transparent substrate and the shielding pattern.

The step of forming a shielding pattern on a second side of the transparent substrate can include the sub-steps of:

Forming a shielding thin film on the second side of the transparent substrate;

Coating a photoresist on a side of the shielding thin film opposing to the transparent substrate;

Exposing the shielding thin film from the first side of the transparent substrate; and Etching the shielding thin film to form a shielding pattern.

In the sub-step of forming a shielding thin film on the second side of the transparent substrate, the shielding thin film can be formed by deposition.

The sub-step of exposing the shielding thin film from the first side of the transparent substrate can be performed by a self-aligned exposure process.

In some other embodiments of the method, the shielding pattern can comprise a black matrix material. In these embodiments, the step of forming a shielding pattern on a second side of the transparent substrate can include the sub-steps of:

Forming a shielding thin film on a second side of the transparent substrate;

Exposing the shielding thin film from the first side of the transparent substrate; and Developing the shielding thin film to form a shielding pattern.

The sub-step of exposing the shielding thin film from the first side of the transparent substrate can be performed by a self-aligned exposure process.

In some embodiments, the method for manufacturing the array substrate as described above can further comprise a step of forming a protection layer on a side of the shielding pattern opposing to the transparent substrate.

Other embodiments may become apparent in view of the following descriptions and the attached drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is obvious that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

In order to address the issue of light reflection on the array substrate and to improve the display effects of display apparatuses, the present disclosure provides an array substrate, a manufacturing method thereof, and a display apparatus.

In one aspect, an array substrate is provided. The array substrate includes a transparent substrate; a plurality of components disposed on a first side of the transparent substrate; and a shielding pattern, disposed on a second side of the transparent substrate, and configured to shield light reflected from a surface of at least one of the plurality of components.

Figure 1:
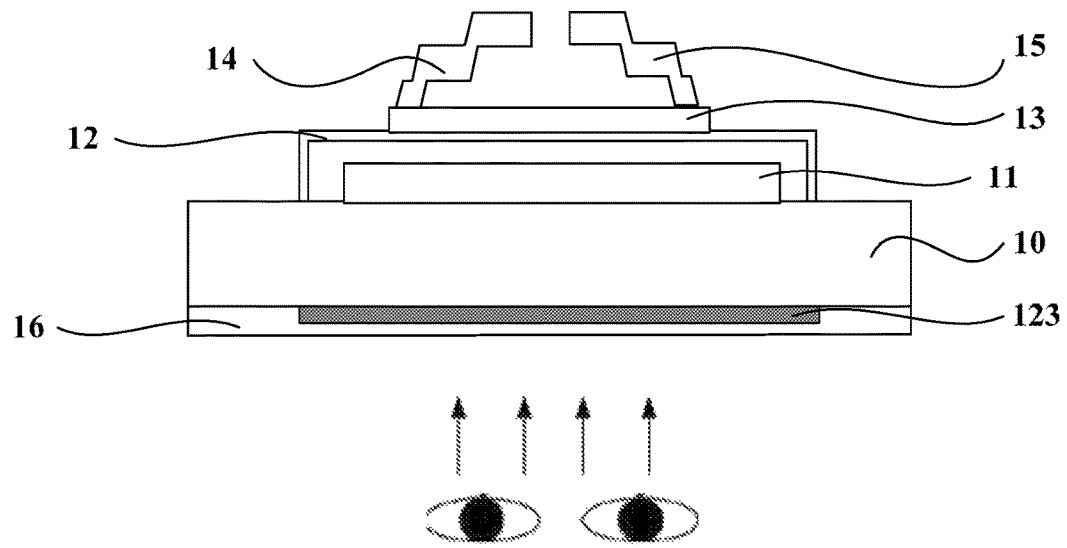
FIG. 1 is a structural diagram of an array substrate according to some embodiments of the disclosure.

FIG. 1 illustrates an array substrate according to some embodiments of the disclosure. The array substrate includes: a transparent substrate 10; a plurality of thin-film transistors, a plurality of gate lines, and a plurality of gate lines, all disposed on one side of the transparent substrate 10; and a shielding pattern 123, disposed on another side of the transparent substrate 10, and configured such that projection of the shielding pattern on the transparent substrate overlaps with the projection of thin-film transistors, gate lines and data lines on the transparent substrate.

In the embodiment as described above, the array substrate is disposed on a light-emitting side of the backlight module. Because the shielding pattern is arranged on the light-emitting side and its projection on the transparent substrate overlaps with the projection of thin-film transistors, gate lines and data lines on the transparent substrate, if a light from the environment is shed on the thin-film transistors, gate lines, and/or data lines, the shielding pattern can absorb a majority of the light. Consequently, the reflected light is greatly reduced, and the display effect of the display device is greatly improved.

Specifically, each of the plurality of thin-film transistor includes: a gate electrode 11, disposed on the light-emitting side of the transparent substrate 10; a gate insulting layer 12, disposed on a side of the gate electrode that is opposing to the transparent substrate; a source layer 13, disposed on a side of the gate insulting layer that is opposing to the transparent substrate; and a source electrode 14 and a drain electrode 15, disposed on a side of the source layer that is opposing to the transparent substrate.

In some embodiments, the projection of the shielding pattern on the transparent substrate has a same graphic pattern as the projection of thin-film transistors, gate lines and data lines on the transparent substrate. Herein the same graphic pattern refers that the projection of the shielding pattern on the transparent substrate and the projection of thin-film transistors, gate lines and data lines on the transparent substrate have identical shapes and sizes to thereby have a complete coincidence.

Figure 2:
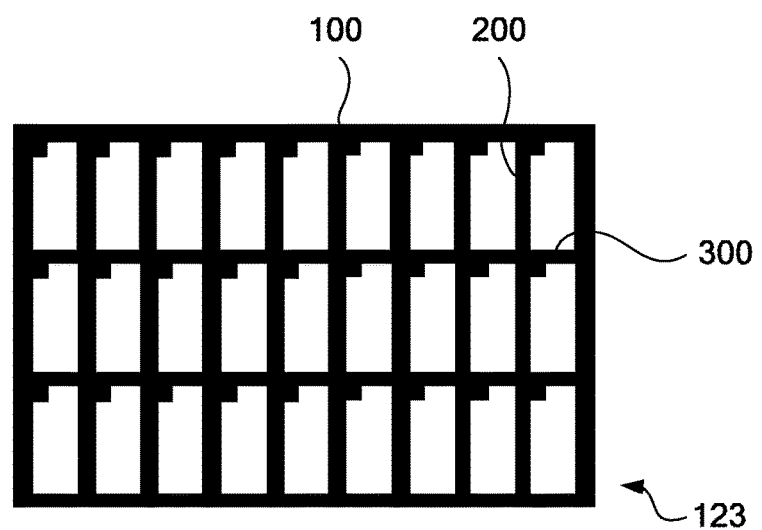
FIG. 2 is a schematic diagram of the projection of a shielding pattern on a transparent substrate according to some embodiments of the disclosure.

FIG. 2 illustrates the projection of a shielding pattern on a transparent substrate, where 100 references the region of projection of thin-film transistors on the transparent substrate; 200 the region of projection of data lines on the transparent substrate; and 300 the region of projection of gate lines on the transparent substrate The shielding pattern can comprise a material having low reflectivity, such as molybdenum oxide, molybdenum-niobium oxide, or a black matrix material.

If molybdenum oxide or molybdenum-niobium oxide is employed for the shielding pattern, the array substrate further comprises an electrostatic shielding layer, disposed between the transparent substrate and the shielding pattern. The electrostatic shielding layer is configured to remove the static electricity between the transparent substrate and the shielding pattern to thereby improve the product quality. Additionally, the use of molybdenum oxide or molybdenum-niobium oxide for the shielding pattern can also reduce the contamination when the array substrate undergoes a deposition process for the manufacture of the shielding pattern in the processing chamber, thereby improving the performance of the products.

In some embodiments, the array substrate can further include a protection layer 16, disposed on a side of the shielding pattern 123 that is opposing to the transparent substrate 10. The protection layer is configured to protect the shielding pattern, and also to provide a smooth surface to the shielding pattern.

In a second aspect, the present disclosure provides a display apparatus, which includes a backlight module and a display panel. The display panel includes a color film substrate, an array substrate according to any of the embodiments as described above, and a liquid crystal layer disposed between the color film substrate and the array substrate.

The array substrate is disposed on a side of the color film substrate that is opposing to the backlight module. In other words, the color film substrate is disposed between the backlight module and the array substrate; the array substrate is disposed on a light-emitting side; and the color film substrate on a light-incident side.

The display apparatus can be a LCD panel, an e-paper, an OLED panel, a mobile phone, a tablet, a television, a monitor, a notebook computer, a digital camera, a navigation system, and any other devices having display functions. It can realize a narrow-bezel or bezel-free design for the display apparatus.

Figure 3:
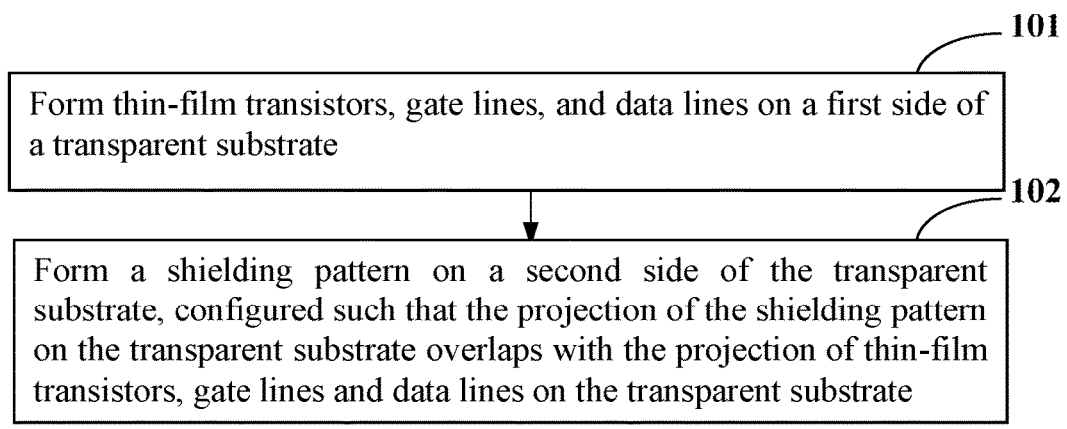
FIG. 3 is a flow chart of a method for manufacturing the array substrate according to a first embodiment of the disclosure.

In a third aspect, the present disclosure provides a method for manufacturing an array substrate, whose flow chart is diagrammed in FIG. 3. The method includes the following steps:

Step 101: forming a plurality of thin-film transistors, a plurality of gate lines, and a plurality of data lines on a first side of a transparent substrate;

Step 102: forming a shielding pattern on a second side of the transparent substrate, configured such that the projection of the shielding pattern on the transparent substrate overlaps with the projection of thin-film transistors, gate lines and data lines on the transparent substrate.

The array substrate manufactured by the method described above is disposed on a light-emitting side of a backlight module. Because the shielding pattern is arranged on the light-emitting side and its projection on the transparent substrate overlaps with the projection of thin-film transistors, gate lines and data lines on the transparent substrate, if a light from the environment is shed on the thin-film transistors, gate lines, and/or data lines, the shielding pattern can absorb a majority of the light. Consequently, the reflected light is greatly reduced, and the display effect of the display device is greatly improved.

In some embodiments, the projection of the shielding pattern on the transparent substrate has a same graphic pattern as the projection of thin-film transistors, gate lines and data lines on the transparent substrate.

The shielding pattern can comprise molybdenum oxide, molybdenum-niobium oxide, or a black matrix.

If molybdenum oxide or molybdenum-niobium oxide is employed for the shielding pattern, the method for manufacturing an array substrate further comprises a step of: forming an electrostatic shielding layer between the transparent substrate and the shielding pattern.

The electrostatic shielding layer is configured to remove the static electricity between the transparent substrate and the shielding pattern to thereby improve the product quality. Additionally, the use of molybdenum oxide or molybdenum-niobium oxide for the shielding pattern can also reduce the contamination when the array substrate undergoes a deposition process for the manufacture of the shielding pattern in the processing chamber, thereby improving the performance of the products.

In some embodiments, the step of forming a shielding pattern on a second side of the transparent substrate comprises the sub-steps of:

forming a shielding thin film on the second side of the transparent substrate;

exposing the shielding thin film by a self-aligned exposure process from the first side of the transparent substrate (i.e. the side having thin-film transistors, gate lines and data lines); and developing the shielding thin film to form a shielding pattern.

In these embodiments, because the metal lines and parts (thin-film transistors, gate lines, and data lines) are not transparent, during exposure, their pattern becomes a non-exposure region, and thus the ultimately obtained shielding pattern comprising molybdenum oxide, molybdenum-niobium oxide, or a black matrix material would have a same graphic pattern as the thin-film transistors, gate lines, and data lines. As such, there is no need to use an additional mask to obtain the graphic pattern of the thin-film transistors, gate lines, and data lines when manufacturing the shielding pattern.

The sub-step of exposing the transparent substrate by a self-aligned exposure process can be performed by a self-aligned exposure machine.

In some embodiment, the method for manufacturing an array substrate further includes a step of: forming a protection layer on a side of the shielding pattern that is opposing to the transparent substrate. The protection layer is configured to protect the shielding pattern, and it can also provide a smooth surface to the shielding pattern.

Figure 4:
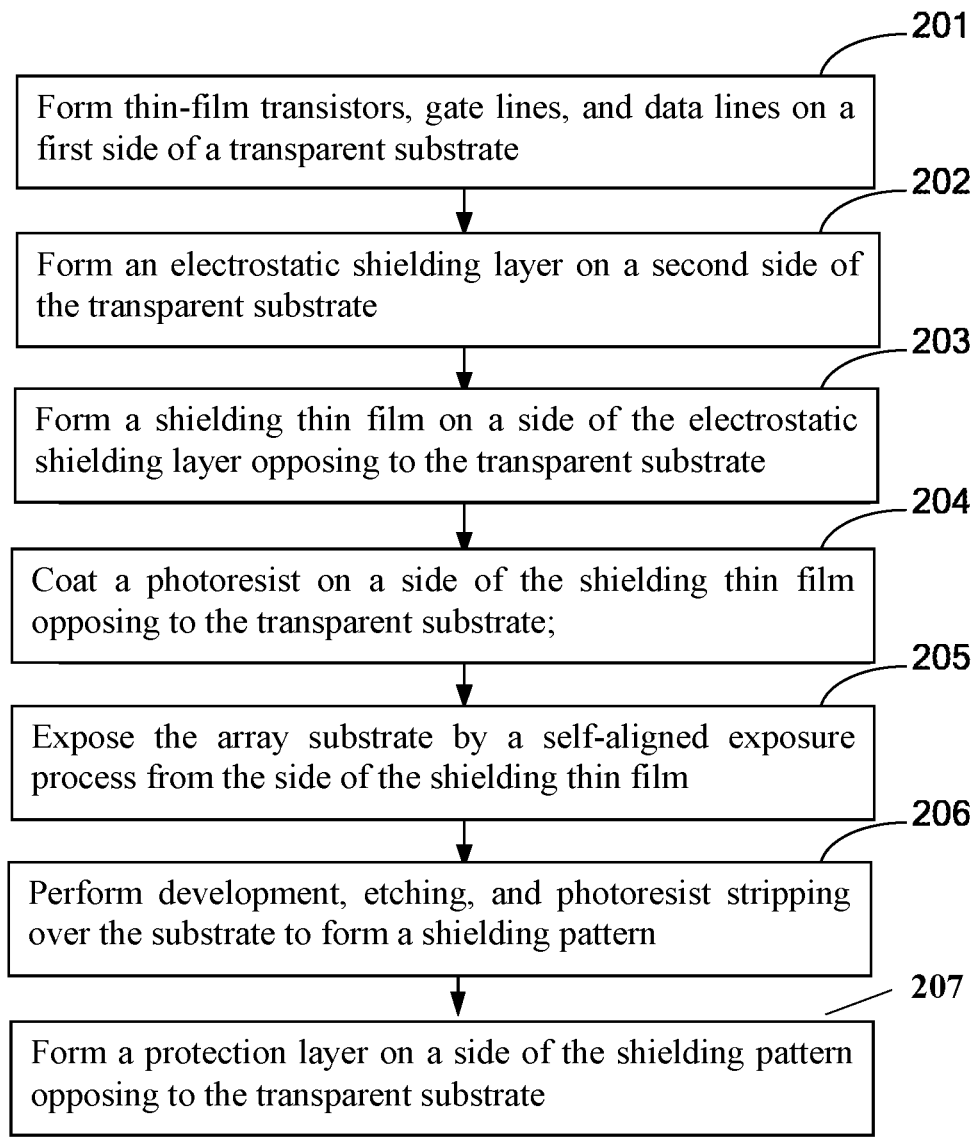
FIG. 4 is a flow chart of a method for manufacturing the array substrate according to a second embodiment of the disclosure.
Figure 5:
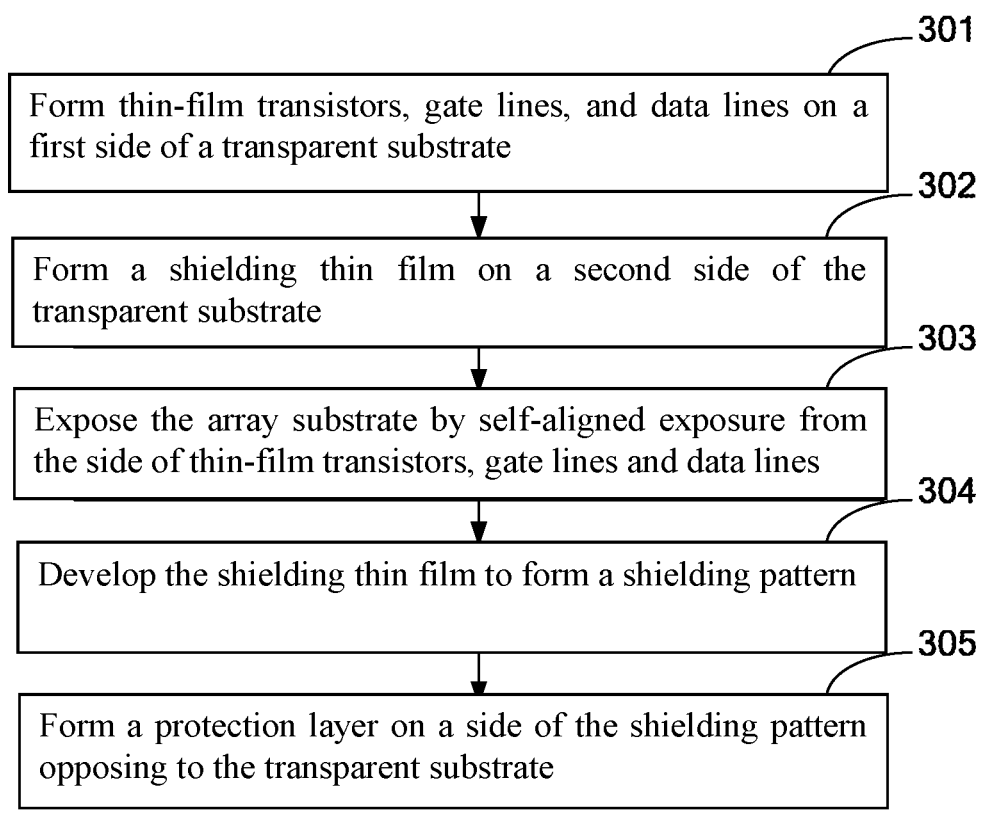
FIG. 5 is a flow chart of a method for manufacturing the array substrate according to a third embodiment of the disclosure.

Two examples are provided in FIGS. 4 and 5 to illustrate the method for manufacturing the array substrate.

As shown in FIG. 4, if molybdenum oxide or molybdenum-niobium oxide is employed for fabricating the shielding pattern, the method for manufacturing an array substrate comprises:

Step 201: forming a plurality of thin-film transistors, a plurality of gate lines, and a plurality of data lines on a first side of a transparent substrate;

Step 202: forming an electrostatic shielding layer on a second side of the transparent substrate;

Step 203: forming a shielding thin film on a side of the electrostatic shielding layer opposing to the transparent substrate;

Step 204: coating a photoresist on a side of the shielding thin film opposing to the transparent substrate;

Step 205: exposing the array substrate by a self-aligned exposure process from the side of the shielding thin film;

Step 206: performing development, etching, and stripping over the substrate to form a shielding pattern, such that the projection of the shielding pattern on the transparent substrate overlaps with the projection of thin-film transistors, gate lines and data lines on the transparent substrate;

Step 207: forming a protection layer on a side of the shielding pattern that is opposing to the transparent substrate.

In this embodiment, because the metal lines and parts (thin-film transistors, gate lines, and data lines) are not transparent, during exposure at Step 204, their pattern becomes a non-exposure region, and thus the ultimately obtained shielding pattern comprising molybdenum oxide or molybdenum-niobium oxide has a same graphic pattern as the hin-film transistors, gate lines, and data lines.

As shown in FIG. 5, if a black matrix material is employed for fabricating the shielding pattern, the method for manufacturing an array substrate comprises:

Step 301: forming a plurality of thin-film transistors, a plurality of gate lines, and a plurality of data lines on a first side of a transparent substrate;

Step 302: forming a shielding thin film on a second side of the transparent substrate;

Step 303: exposing the array substrate by a self-aligned exposure process from the side of the thin-film transistors, gate lines and data lines;

Step 304: developing the shielding thin film to form a shielding pattern, such that the projection of the shielding pattern on the transparent substrate overlaps with the projection of thin-film transistors, gate lines and data lines on the transparent substrate;

Step 305: forming a protection layer on a side of the shielding pattern that is opposing to the transparent substrate.

In this embodiment, because the metal lines and parts (thin-film transistors, gate lines, and data lines) are not transparent, during exposure at Step 303, their pattern becomes a non-exposure region, and thus the ultimately obtained shielding pattern comprising black matrix material has a same graphic pattern as the hin-film transistors, gate lines, and data lines.

The array substrate manufactured by the various embodiments of the method as described above is disposed on a light-emitting side of a backlight module. Because the shielding pattern is arranged on the light-emitting side and its projection on the transparent substrate overlaps with the projection of thin-film transistors, gate lines and data lines on the transparent substrate, if a light from the environment is shed on the thin-film transistors, gate lines, and/or data lines, the shielding pattern can absorb a majority of the light. Consequently, the reflected light is greatly reduced, and the display effect of the display device is greatly improved. As such, a narrow-bezel or bezel-free design for the display apparatus can also be realized.

All references cited in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An array substrate, comprising:
a transparent substrate;
a plurality of components, disposed on a first side of the transparent substrate; and
a shielding pattern, disposed on a second side of the transparent substrate, and configured to shield light reflected from a surface of at least one of the plurality of components;
wherein:
projection of the shielding pattern on the transparent substrate overlaps with projection of the plurality of components on the transparent substrate; and
the projection of the shielding pattern on the transparent substrate has a same pattern as the projection of the plurality of components on the transparent substrate.

2. The array substrate of claim 1, wherein the plurality of components comprise a plurality of thin-film transistors, a plurality of gate lines, and a plurality of data lines.

3. The array substrate of claim 1, wherein the shielding pattern comprises a black matrix material.

4. A display apparatus, comprising the array substrate according to claim 1.

5. The display apparatus according to claim 4, further comprising a backlight module and a color film substrate, wherein the backlight module is disposed on one side of the color film substrate opposing to the array substrate.

6. An array substrate, comprising:
a transparent substrate;
a plurality of components, disposed on a first side of the transparent substrate; and
a shielding pattern, disposed on a second side of the transparent substrate, and configured to shield light reflected from a surface of at least one of the plurality of components;
wherein the shielding pattern comprises molybdenum oxide or molybdenum-niobium oxide, and the array substrate further comprises an electrostatic shielding layer, disposed between the transparent substrate and the shielding pattern.

7. A display apparatus, comprising the array substrate according to claim 6.

8. The display apparatus of claim 7, wherein the plurality of components comprise a plurality of thin-film transistors, a plurality of gate lines, and a plurality of data lines.

9. An array substrate, comprising:
a transparent substrate;
a plurality of components, disposed on a first side of the transparent substrate;
a shielding pattern, disposed on a second side of the transparent substrate, and configured to shield light reflected from a surface of at least one of the plurality of components; and
a protection layer, disposed on a side of the shielding pattern opposing to the transparent substrate.

10. A method for manufacturing the array substrate according to claim 9, the method comprising:
forming a plurality of thin-film transistors, a plurality of gate lines, and a plurality of data lines on a first side of a transparent substrate; and
forming the shielding pattern on the second side of the transparent substrate, wherein the shielding pattern is configured to shield light reflected from a surface of at least one of the plurality of thin-film transistors, the plurality of gate lines, and the plurality of data lines.

11. The method according to claim 10, wherein projection of the shielding pattern on the transparent substrate overlaps with projection of the plurality of thin-film transistors, the plurality of gate lines and the plurality of data lines on the transparent substrate.

12. The method according to claim 11, wherein the projection of the shielding pattern on the transparent substrate has a same pattern as the projection of the plurality of thin-film transistors, the plurality of gate lines, and the plurality of data lines on the transparent substrate.

13. The method according to claim 12, wherein the shielding pattern comprises molybdenum oxide or molybdenum-niobium oxide.

14. The method according to claim 13, further comprising, between the forming a plurality of thin-film transistors, a plurality of gate lines, and a plurality of data lines on a first side of a transparent substrate and the forming the shielding pattern on a second side of the transparent substrate:
forming an electrostatic shielding layer on a second side of the transparent substrate, wherein the electrostatic shielding layer is disposed between the transparent substrate and the shielding pattern.

15. The method according to claim 14, wherein the forming the shielding pattern on a second side of the transparent substrate comprises:

forming a shielding thin film on the second side of the transparent substrate;

coating a photoresist on a side of the shielding thin film opposing to the transparent substrate;

exposing the shielding thin film from the first side of the transparent substrate; and etching the shielding thin film to form a shielding pattern.

16. The method according to claim 15, wherein in the forming a shielding thin film on the second side of the transparent substrate, the shielding thin film is formed by deposition.

17. The method according to claim 15, wherein the exposing the shielding thin film from the first side of the transparent substrate is performed by a self-aligned exposure process.

18. The method according to claim 12, wherein the shielding pattern comprises a black matrix material.

19. The method according to claim 18, wherein the forming the shielding pattern on a second side of the transparent substrate comprises:

forming a shielding thin film on a second side of the transparent substrate;

exposing the shielding thin film from the first side of the transparent substrate; and developing the shielding thin film to form a shielding pattern.

20. The method according to claim 19, wherein the exposing the shielding thin film from the first side of the transparent substrate is performed by a self-aligned exposure process, the method further comprising forming a protection layer on a side of the shielding pattern opposing to the transparent substrate.

\* \* \* \* \*